(12) United States Patent
Chang et al.

(10) Patent No.: US 8,186,054 B2
(45) Date of Patent: May 29, 2012

(54) METHOD OF FABRICATING BOARD HAVING HIGH DENSITY CORE LAYER AND STRUCTURE THEREOF

(75) Inventors: Chien-Wei Chang, Taoyuan (TW); Ting-Hao Lin, Taipei (TW); Jen-Fang Chang, Taoyuan (TW); Yu-Te Lu, Taoyuan (TW); Chia-Chi Lo, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 294 days.

(21) Appl. No.: 12/725,460

(22) Filed: Mar. 17, 2010

(65) Prior Publication Data

US 2010/0170088 A1 Jul. 8, 2010

Related U.S. Application Data

(62) Division of application No. 11/766,194, filed on Jun. 21, 2007, now Pat. No. 7,875,809.

(51) Int. Cl.
*H01K 3/10* (2006.01)

(52) U.S. Cl. ................ 29/852; 29/829; 29/830; 29/831; 29/832

(58) Field of Classification Search ............. 29/852, 29/830, 831, 832, 829, 846, 847; 174/255, 174/264, 259, 262, 266; 361/413, 400, 403, 361/406, 792, 795; 438/637, 125, 639
See application file for complete search history.

(56) References Cited

U.S. PATENT DOCUMENTS

| 4,604,799 | A | * | 8/1986 | Gurol | 29/847 |
| 4,706,167 | A | * | 11/1987 | Sullivan | 361/774 |
| 6,035,527 | A | * | 3/2000 | Tamm | 29/852 |
| 2005/0155789 | A1 | * | 7/2005 | Suzuki et al. | 174/255 |

* cited by examiner

*Primary Examiner* — Derris Banks
*Assistant Examiner* — Tai Nguyen
(74) *Attorney, Agent, or Firm* — Lin & Associates IP, Inc.

(57) ABSTRACT

Structure and method of making a board having plating though hole (PTH) core layer substrate and stacked multiple layers of blind vias. More stacking layers of blind vias than conventional methods can be achieved. The fabrication method of the board having high-density core layer includes the following: after the making of the PTH, the filling material filled inside the PTH of the core layer is partially removed until the PTH has reached an appropriate flattened depression using etching; then image transfer and pattern plating are performed to fill and to level the depression portion up to a desired thickness to form a copper pad (overplating) as the core layer substrate is forming a circuit layer; finally using electroless copper deposition and the pattern plating to make the product.

7 Claims, 3 Drawing Sheets

US 8,186,054 B2

METHOD OF FABRICATING BOARD HAVING HIGH DENSITY CORE LAYER AND STRUCTURE THEREOF

CROSS-REFERENCES TO RELATED APPLICATIONS

This is a division of U.S. application Ser. No. 11/766,194, filed Jun. 21, 2007 now U.S. Pat. No. 7,875,809, which is incorporated herewith by reference.

BACKGROUND OF THE INVENTION

1. Field of the Invention

The present invention is generally related to a method of fabricating a board and its structure, and in particular, to a method of fabricating a board having high-density core layer and the structure thereof 2. The Prior Arts With the trend of electronic products becoming smaller, thinner, lighter, and shorter and at the same time having more additional functions, the number of I/Os residing on the chips are rapidly increased. The corresponding electronics packaging technology have also been evolving to accommodate the diverse integrated circuits. Nowadays, most high-level products adopt the flip-chip technology; the package density has dropped from the 90 nm to 65 nm, and even to 45 nm. Meanwhile, the line width on the IC board has become thinner, going from 50 μm to 20 μm (pitch 40 μm), and even to 15 μm (pitch 30 μm).

Apart from the earlier packaging technologies such as dual in line package (DIP), there are many other packaging technologies such as the chip carrier (CC), flip chip (FC), pin grid array (PGA), tape carrier (TC), hermetic package, ball grid array (BGA), quad flat package (QFP), lead on chip (LOC), chip scale package (CSP), bare die, tape carrier package (TCP), etc.

Of all these packaging boards, the line width and the line width/line spacing (L/S) of VOP (via on PTH) made by the traditional FC, CSP technologies cannot reach 40 μm or below, which becomes a bottleneck in the reduction of the overall board density.

SUMMARY OF THE INVENTION

A primary objective of the present invention is to provide a method of fabricating a board having high-density blind via stacked structure. The fabrication method mainly includes the steadily making of multiple-layers of blind vias that are stacked on PTH (VOP) on a core layer. The main fabrication procedure is as follows: using the plating through hole filling resin, encapsulation, grinding, buffing, and polishing are performed; then by using laser etching, sand blasting, plasma etching, chemical etching, and other methods for partially removing the filling material filled inside the PTH of the core layer until the core layer has reached an appropriate flattened depression; then a thin copper metal layer is coated on the surface at a thickness of 3~12 μm; and then the image transfer and pattern plating operations are performed to fill and to level the depression portion of the filling material up to desired thickness, and to produce the copper pad, and the necessary circuitry.

The SAP technique can be utilized for making the circuits and traces if the high-density thin line structure is needed. Here, the copper layer on the surface can be removed completely, and then the methods such as chemical vapor deposition of copper and the pattern plating can be adopted for making the product. Because of the added flexibility of and reliability of the electroplating process and the structure being adopted, it can substantially improve the design flexibility of the product and the reliability of the electrical circuits. Due to the possibility of the usage of the SAP technology, the thin line fabrication is able to reach the capability for the line/space (L/S) at 20/20 μm.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

FIGS. 1A~1I are a plurality of cross sectional views showing the fabrication process of a board having high-density core layer according to an embodiment of the present invention, in which FIGS. 1A~1D show steps which are similar to the conventional fabrication process of a board having high-density core layer, and FIGS. 1E~1I show the remaining fabrication process for the board having high-density core layer according to the embodiment.

Figure 1A:
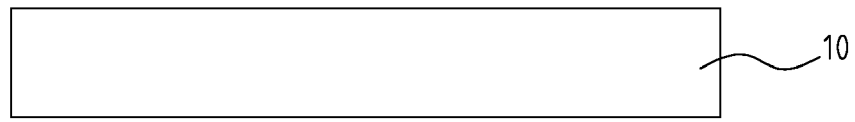
FIGS. 1A~1I are a plurality of cross-sectional views showing the fabrication process of a board having high-density core layer in accordance with an embodiment of the present invention.
Figure 1B:
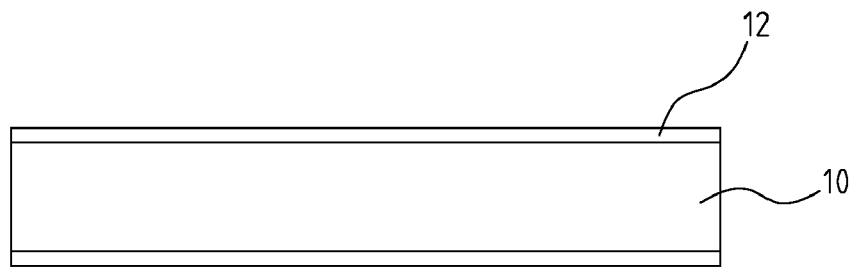
Figure 1C:
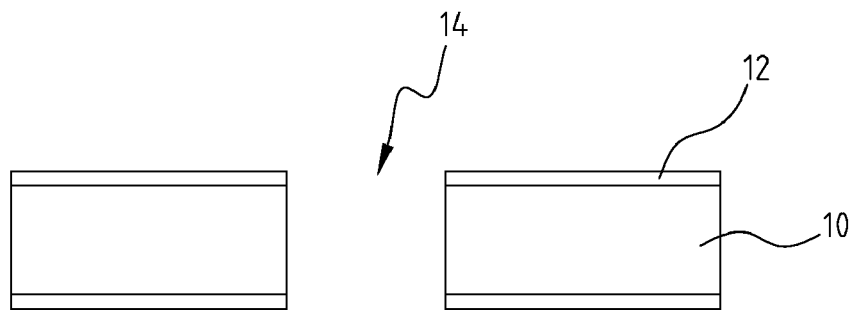
Figure 1D:
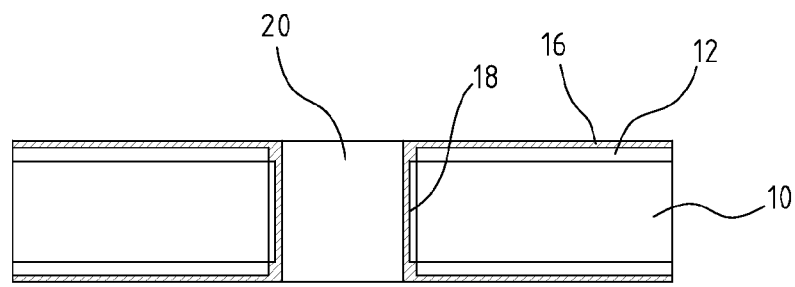
Figure 1E:
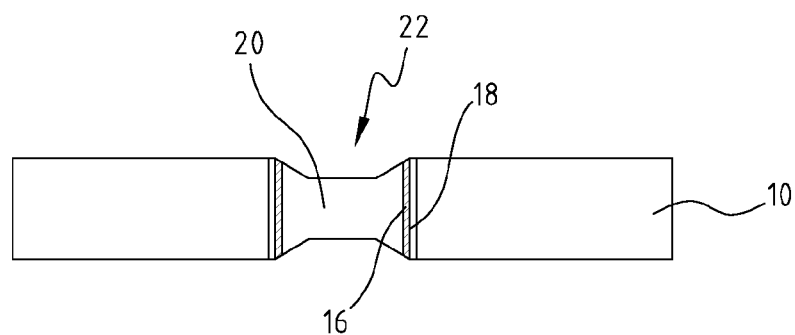
Figure 1F:
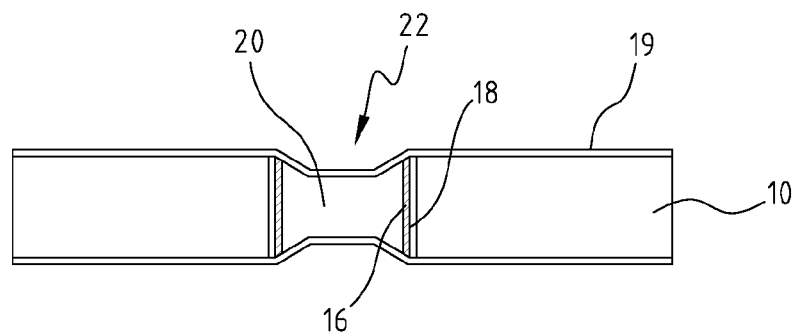
Figure 1G:
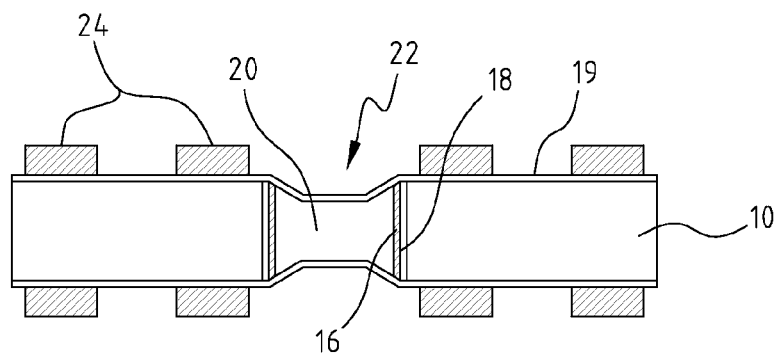
Figure 1H:
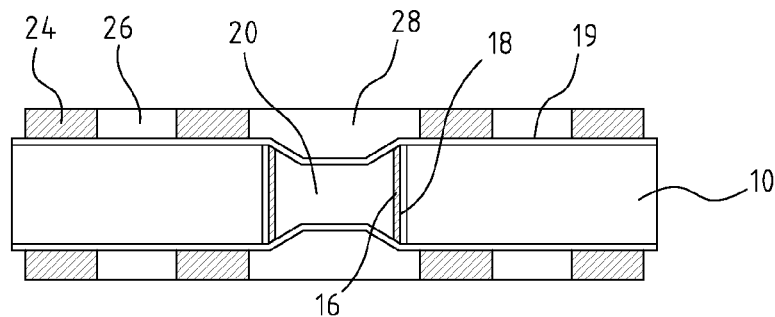
Figure 1I:
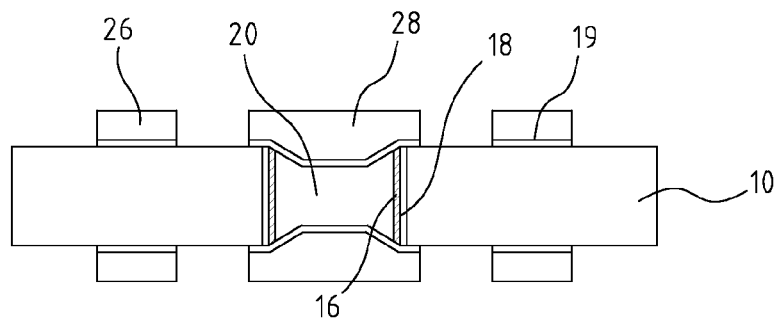

The fabrication method for the board having the high-density core layer of the present invention mainly focuses on the core layer substrate having a plating through hole (PTH) 14 (shown in FIG. 1C), the outside of the PTH 14 of the core layer substrate is formed with a depression portion 22 as shown in FIG. 1E; and a surface metal layer 12 is thinned down to 3~12 μm. And then image transfer and pattern plating operations are performed to fill the depression portion 22 (namely, removing the thickness of the filling material 20), thus to form the circuit layer 26 and a copper pad 28 (overplating) that is required, as illustrated in FIG 1I. The PTH 14 is adapted to provide conducting between the internal wiring and the external wiring of the board.

There are two types of methods for forming the aforementioned depression portion 22: one is by excavation and the other by an insufficient filling method. Specifically speaking, when the depression portion 22 is formed on the outside of the PTH 14, by using the laser etching, sand blasting, plasma etching, chemical etching, etc. to remove the filling material 20 inside the PTH of the core layer, a portion of the filling material 20 which is filled in the PTH 14 can be removed, and thus the depression portion 22 is formed. Optionally, the other method is by filling the filling material 22 into the PTH 14 steadily, while not filling up the PTH 14 to the extent as shown in FIG. 1D, until the depression portion 22 is formed on the outside of the PTH 14. Of these two methods regarding the formation of the depression portion 22, the excavation method is easier to perform than the insufficient filling method. The filling material 20 is of a high dielectric coefficient insulation material.

After the depression portion 22 is formed, the material on the substrate 10 needs to be removed for fabricating the super-thin circuit and to continue making the circuit layer 26. When the material on the substrate 10 is removed, because both the depression portion and the substrate are made of insulation material, the electroless copper 19 must be formed on these two items before the circuit layer 26 is electroplated (shown in FIG. 1F). Then, by using a patterned photoresistive layer 24 as shown in FIG. 1G, the depression portion 22 is filled and leveled; and the circuit layer 26 is made as shown in FIG. 1H. Finally, the patterned photoresistive layer 24 is removed as shown in FIG. 1I.

Hence, the SAP technique can be utilized to make the circuit if high-density thin line structure is needed. Here, the metal layer 12 on the surface can be removed completely, and then methods such as electroless copper deposition and the pattern plating can be adopted for making the product. Due to the adoption of the electroplating process and structural processing being adopted, the area and the thickness of the copper coated at the corner of the PTH increase significantly and can be flexibly adjusted. Such structure can substantially improve the electrical reliability of the product and the mechanical strength of the circuits. In addition, because of the feasibility of this structure, the conventional stacking limit of the 3 blind vias on the PTH can then be increased to 4 or above. And also, due to the possibility of using the SAP technology, thin line fabrication capability could reach a line width/line spacing of 20/20 μm.

In order to fabricate the core layer substrate as illustrated in FIG. 1D, a substrate 10 of 0.8 mm thickness is first provided (as shown in FIG. 1B), and a metal layer 12 of 1~12 μm thickness is formed on the substrate 10. The substrate 10 is usually made of Bismaleimide Triazine (BT) or other organic material, and as well as ceramic material. Then, using mechanical drilling, the metal layer 12 and the substrate 10 are penetrated through to form a PTH 14 with 100~300 μm diameter (preferably 150 μm) as shown in FIG. 1C. And then the electroplated metal layer 16 is formed with 10~30 μm in diameter on the metal layer 12 and on the side wall of the through hole 5 (already coated with electroless copper 18) on the core substrate as shown in FIG. 1D. Based on the aforementioned method, it can be decided to whether fill the PTH 14 entirely or partially with the filling material 20.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A method of fabricating a board having high-density core layer, comprising:
   providing a core layer substrate comprising of a plating through hole (PTH);
   forming a depression portion outside of the PTH of the core layer substrate;
   using pattern plating to fill and to level the depression portion to form a copper pad, as the core layer substrate is forming a circuit layer; and
   stacking one or more layers of blind vias on the copper pad on the PTH.

2. The method of fabricating the board having high-density core layer as claimed in claim 1, further comprising:
   partially removing the filling material filled in the PTH to form the depression portion.

3. The method of fabricating the board having high-density core layer as claimed in claim 2, wherein the filling material is of a high dielectric coefficient insulation material.

4. The method of fabricating the board having high-density core layer as claimed in claim 1, wherein laser etching, sand blasting, plasma etching, or chemical etching is used for removing a portion of the filling material in the PTH of the core layer.

5. The method of fabricating the board having high-density core layer as claimed in claim 1, wherein the forming of the depression portion outside of the PTH of the core layer substrate, further comprising:
   filling a filling material in the PTH until the outside of the PTH takes on a depression shape of the depression portion.

6. The method of fabricating the board having high-density core layer as claimed in claim 5, wherein the filling material is of a high dielectric coefficient insulation material.

7. The method of fabricating the board having high-density core layer as claimed in claim 1, wherein the PTH is used for provide conducting between the internal wiring and the external wiring of the board.

* * * * *